(12) United States Patent
Guo et al.

(10) Patent No.: US 8,487,641 B2
(45) Date of Patent: Jul. 16, 2013

(54) PAD STRUCTURE AND TEST METHOD

(75) Inventors: Qiang Guo, Shanghai (CN); Bin Gong, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 467 days.

(21) Appl. No.: 12/792,533

(22) Filed: Jun. 2, 2010

(65) Prior Publication Data

US 2011/0062976 A1  Mar. 17, 2011

(30) Foreign Application Priority Data

Sep. 11, 2009 (CN) .......................... 2009 1 0195635

(51) Int. Cl.
*G01R 31/20* (2006.01)
(52) U.S. Cl.
USPC .................................... 324/754.01
(58) Field of Classification Search
USPC ............... 324/754.01–754.3, 755.01–755.11, 324/762.01–762.1; 257/48; 438/14–18
See application file for complete search history.

(56) References Cited

U.S. PATENT DOCUMENTS

| 6,621,260 | B2 * | 9/2003 | Eldridge et al. ......... 324/762.02 |
| 7,105,933 | B2 * | 9/2006 | Haza et al. ..................... 257/786 |
| 2004/0178787 | A1 | 9/2004 | Liu |
| 2009/0121734 | A1 | 5/2009 | Wang et al. |
| 2009/0209052 | A1 | 8/2009 | Val |

FOREIGN PATENT DOCUMENTS

| CN | 1823277 A | 8/2006 |
| WO | WO 2007/077842 | 7/2007 |

* cited by examiner

*Primary Examiner* — Tung X Nguyen
(74) *Attorney, Agent, or Firm* — Squire Sanders (US) LLP

(57) ABSTRACT

The present invention discloses a pad structure and a method for testing a integrated circuit. The structure includes the first pads and the second pads, where the first pads are distributed over a peripheral portion of the integrated circuit and connected with lead-out wires of the integrated circuit, and the second pads are connected with a metal line at a circuit portion in the integrated circuit and are sized larger than the minimum characteristic dimension of the metal line and of the integrated circuit and smaller than the size of the first pads. The pad structure and method can position a test portion with improved efficiency. Correspondingly, a probe can be used to position the test portion with improved accuracy as well.

16 Claims, 4 Drawing Sheets

PAD STRUCTURE AND TEST METHOD

FIELD OF THE INVENTION

The present invention relates to the field of integrated circuits layout and testing, and in particular to a pad structure and a test method.

BACKGROUND OF THE INVENTION

As the integrated circuits (IC) technology constantly advances, the characteristic dimension of the IC device becomes small. Correspondingly, the circuit debug and defect detection also become increasingly challenging. The electrical testing is a very important approach to detect the process issues and defects in the design or manufacturing of an integrated circuit.

It is typical in an electrical test to use a probe to probe and measure a standard pad in an integrated circuit in order to acquire electrical parameters and to test the function of the integrated circuit or make a failure analysis on the failing integrated circuit by analyzing the electrical data. However, the probe used in the standard pad is significantly larger in size than a metal line in an internal circuit portion in the integrated circuit, so such a test method generally can acquire only overall electrical parameters of the integrated circuit but is difficult to test some circuit portions in the integrated circuit.

At present, a nano probing, an emerging advanced failure analysis technique has been developed for circuit debug and electrical characterization of the special parts/segments in the IC, e.g., a metal line, an MOS transistor, a specific functional module, etc. Due to nano probing with the small size typically ranging from 50 nm to 100 nm, it can theoretically be used to measure electrical characteristics of structures in the IC. Now various nano-probes for the test have emerged based upon nano probing. For example, a nano-probe and a method for manufacturing the same has been disclosed in Patent Publication WO2007077842A1, and also a nano-probe card and a method for manufacturing the same have been disclosed in Patent Publication US20090121734A1.

However, the efficiency is very low when applying the nano-probe in the current structures accurately with the aid of a Scanning Electron Microscope (SEM), due to the small size of the probe.

Further referring to FIG. 1, standard pads 100 are typically connected only to an input and an output of a metal line, so it is neither possible to apply the probe on the interested segment delimited by the metal line in the shape of, for example, multiple fingers to probe and measure the interested segment, nor possible to perform automatic probing and measuring, which may further degrade the efficiency of the test.

Referring to FIG. 2, a test of an across-layer metal line is required, for example, in an electro migration test, and since the standard pads 100 are typically connected only to a metal line at the present layer, a failure occurring with a via 300 between an overlying metal line 200 and an underlying metal line 400 can not be detected with the existing probing and measuring method.

Moreover, current technologies for manufacturing IC have developed up to technology in 65 nm, so a metal line in a circuit portion in the IC is also approximate in size to the probe pin used in nano probing. Thus, there arises both a significant increase of difficulty for positioning the probe on a test portion in the test and a risk of damaging the metal line during the detection, which may be disadvantageous to acquire an accurate result of the test.

SUMMARY OF THE INVENTION

The invention is intended to address the issue in the prior art of both inefficiency of testing a circuit portion in an integrated circuit and tendency to damage a metal line of the circuit portion in the integrated circuit, which may be disadvantageous to acquire an accurate result of the test.

In order to address the foregoing issue, an embodiment of the invention provides a pad structure including first pads and second pads, wherein the first pads are distributed over a peripheral portion of an integrated circuit and connected with lead-out wires of the integrated circuit, and the second pads are connected in parallel with a metal line at a circuit portion in the integrated circuit and are sized larger than the minimum characteristic dimension of the metal line and of the integrated circuit and smaller than the size of the first pads.

Optionally, the second pads are singled layer metal pads, and the metal pads are composed of the same metal as the layer of the metal line at the circuit portion in the integrated circuit.

Optionally, the second pads are structured in a stack consisted of one or more layers of metal pads and vias, and the metal pads at the lowest layer in the stack structure are connected in parallel with the metal line at a corresponding layer of the circuit portion in the integrated circuit.

Optionally, the second pads are structured in a stack consisted of one or more layers of metal pads and vias, and the metal pads at the same layer in the stack structure as the metal line of the circuit portion in the integrated circuit are connected with the metal line, while the remaining layers of metal pads float.

Optionally, the second pads are micro pads and the size of the micro pads is larger than 0.1 μm.

Correspondingly, another embodiment of the invention further provides a method for testing an integrated circuit with the foregoing pad structure, the method comprising the step of: probing and measuring first pads by a probe suitable for the first pads to acquire corresponding electrical parameters; and probing and measuring second pads at a specific test portion in the integrated circuit by a nano-probe or normal probe to acquire corresponding electrical parameters.

Optionally, when probing and measuring a metal line in the integrated circuit, the nano-probe is applied on both adjacent second pads in the test portion which are connected in parallel with the metal line to perform the probing and measuring sequentially, as an automatic test.

Optionally, when probing and measuring a metal line in the integrated circuit, the nano-probe is applied on the second pads in the test portion which are connected in parallel with the metal line to perform the probing and measuring in a dichotomy way, as an automatic test.

Compared with the prior art, the foregoing pad structure and test method have the following advantages: the size of the second pads is larger than the minimum characteristic dimension of the metal line in the integrated circuit and of the integrated circuit, and compared with probing and measuring the metal line in the integrated circuit directly by the nano-probe, it will be simpler to use the nano-probe or normal probe to probe and measure the second pads to acquire electrical parameters and hence more efficient to position a test portion.

Correspondingly, the nano-probe or normal probe can be used to position the test portion with improved accuracy as well based upon the above reasoning.

In an optional schema, a layer of metal pads of the second pads structured in a stack is connected with a respective layer of metal line, so a test of an across-layer metal line is possible without stripping destructively the integrated circuit. Therefore, both an improvement of the efficiency of and saving of a cost of the test can be achieved relative to the case of destructive stripping beforehand.

BRIEF DESCRIPTION OF THE DRAWINGS

FIG. 5a illustrates a schematic diagram of an embodiment of a test for the structure of the second pads illustrated in FIG. 4a; and FIG. 5b illustrates a schematic diagram of another embodiment of a test for the structure of the second pads illustrated in FIG. 4a.

DETAILED DESCRIPTION OF THE INVENTION

As can be apparent from the foregoing descriptions of the drawback of the prior art, nano probing with a smaller nano-probe size is adopted in the prior art, but there is still a lack of a pad structure in an integrated circuit to cooperate with nano probing, so various issues still may occur with a test in the integrated circuit.

In view of this, the invention arranges a pad structure suitable for a nano-probe in an integrated circuit, so that the nano-probe can function effectively in a test of a specific portion. According to an embodiment of the invention, the pad structure includes first pads and second pads, wherein the first pads are distributed over a peripheral portion of the integrated circuit and connected with lead-out wires of the integrated circuit, and the second pads are connected in parallel with a metal line of a circuit portion in the integrated circuit and are sized larger than the minimum characteristic dimension of the metal line and of the integrated circuit and smaller than the size of the first pads.

For example, the second pads are micro pads and the size of the micro pads may range from 1 μm to 40 μm, and particularly the size thereof may range from 1 μm to 10 μm for an application to a nano-probe and from 10 μm to 40 μm for an application to a normal probe. The size of the second pad illustrated here is merely illustrative but not limitative of the size thereof. The first pads may be standard pads.

In the foregoing embodiment, the size of the second pads is larger than the minimum characteristic dimension of the metal line in the integrated circuit and of the integrated circuit, it will be simpler to probe and measure the second pads by the nano-probe to acquire electrical parameters and hence more efficient to position an test portion than to probe and measure the metal line in the integrated circuit by the nano-probe directly.

Correspondingly, the nano-probe can be used to position the test portion with improved accuracy as well.

On the principle of the foregoing, a variety of second pads can be arranged in a circuit portion in an integrated circuit to accommodate different test demands. This will be further explained illustratively below.

Figure 1:
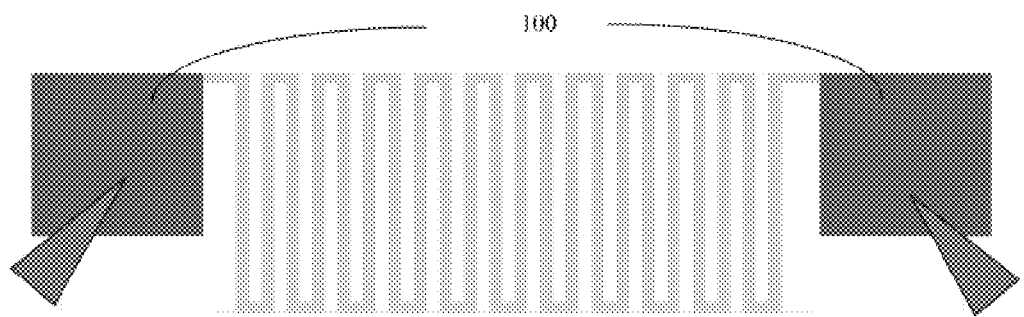
FIG. 1 illustrates a schematic diagram for testing a metal line in an integrated circuit in the prior art.
Figure 2:
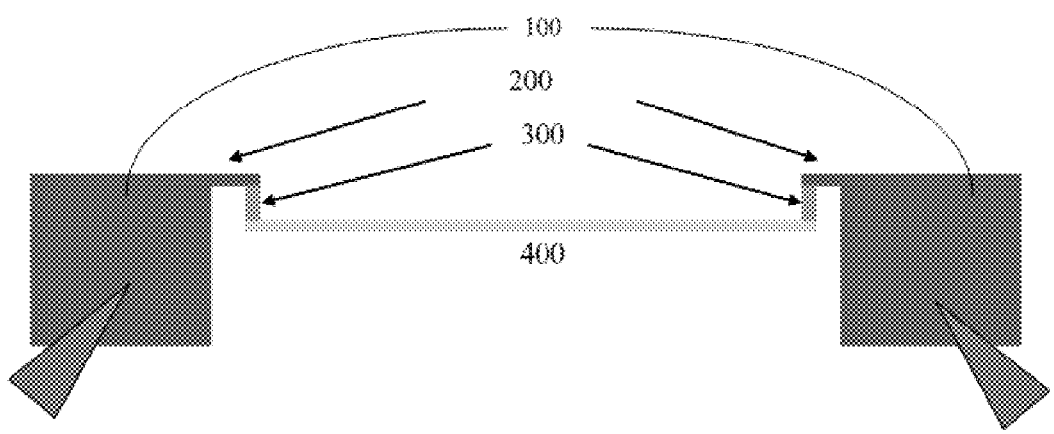
FIG. 2 illustrates a schematic diagram of an electro migration test in the prior art.
Figure 3:
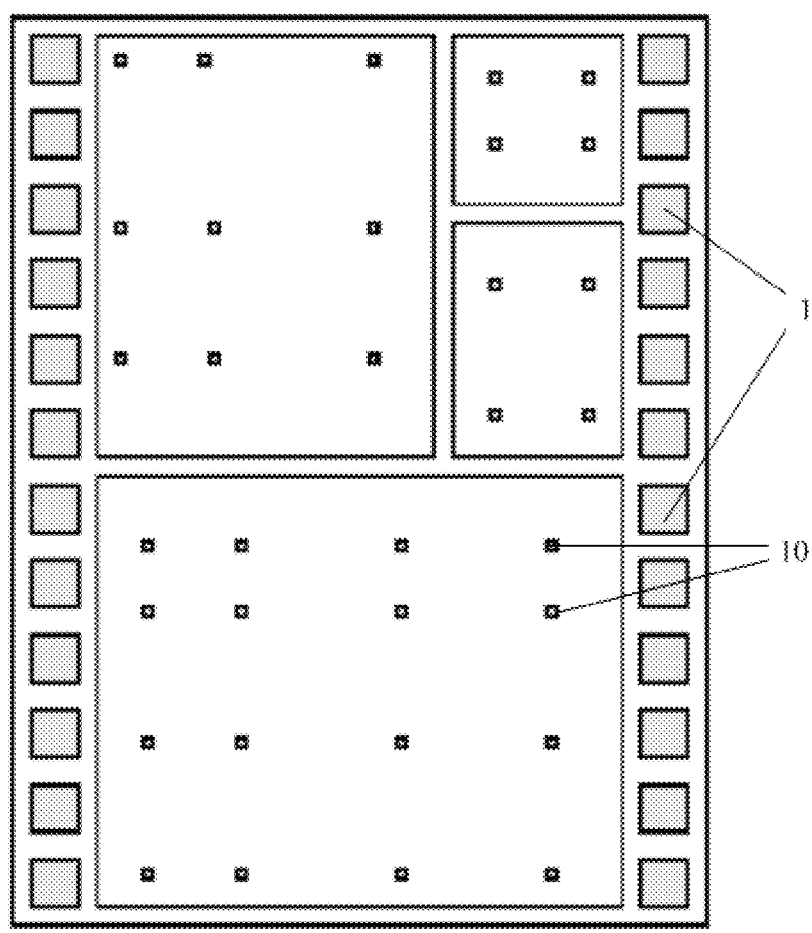
FIG. 3 illustrates a schematic diagram of an embodiment of a pad structure according to the invention.

Referring to FIG. 3, the pad structure according to an embodiment of the invention includes first pads 1 and second pads 10, wherein the first pads 1 are distributed on two sides of an integrated circuit chip and adapted for test package lead-out wires of the entire integrated circuit chip and the entire chip, and the second pads 10 are distributed over four circuit portions of the integrated circuit chip and adapted for circuit debug and failure analysis of the circuit portions.

Figure 4A:
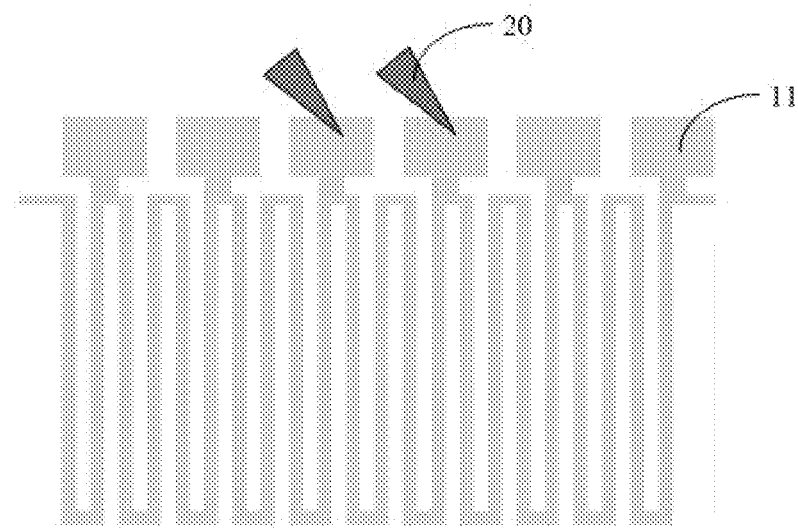
FIG. 4a illustrates a schematic diagram of an embodiment of a structure of the second pads in the pad structure illustrated in FIG. 3.

In the foregoing embodiment, the second pads 10 can be structured in various forms. Referring to FIG. 4a, the second pads 11 are connected in parallel with a metal line in the shape of multiple fingers in an embodiment of the second pads. The number of the second pads 11 provided at a device portion in an integrated circuit shall be determined without influencing the performance of devices. For a test on a segment of the metal line illustrated in FIG. 4a, a nano-probe 20 is simply placed on the second pads 11 to acquire corresponding electrical parameters. Due to the second pads 11 being sized larger than the metal line, the nano-probe 20 can be placed thereon more readily, so both the efficiency and the accuracy of applying a test portion can be improved.

The second pads can be structured in a stack in another embodiment. The second pads structured in a stack can be structured in one or more layers of metal pads combined with vias.

In the structure of one metal layer pads combined with the vias, the pads can be connected in parallel with a metal line at a circuit portion in the integrated circuit via the vias.

Figure 4B:
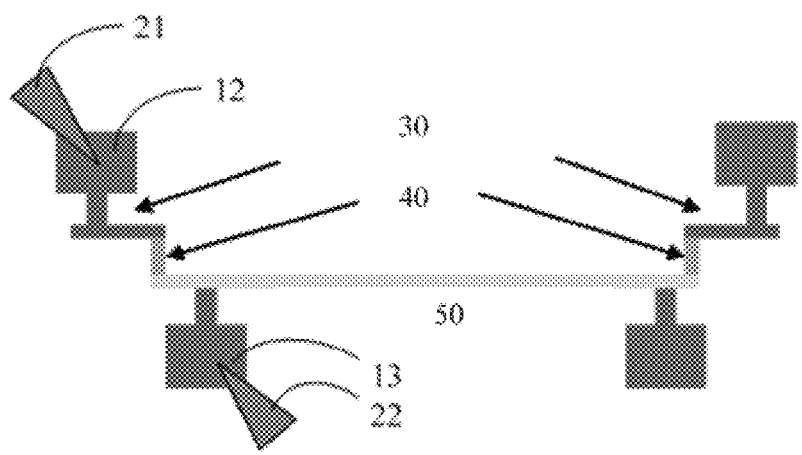
FIG. 4b illustrates a schematic diagram of another embodiment of a structure of the second pads in the pad structure illustrated in FIG. 3.

In an embodiment with reference to FIG. 4b, metal pads at the lowest layer among the second pads structured in a stack are connected in parallel with a metal line at a test layer, and the metal pads at the lowest layer are of the same metal layer as the metal line under test. Correspondingly, the number of layers of metal pads in the stack structure is determined dependent upon the number of layers from the metal layer where the metal line, with which the metal pads are connected in parallel, is located to the top metal layer. For example, the second pad 12 is connected in parallel with an overlying metal line 30, and the second pad 13 is are connected in parallel with an underlying metal line 50, so the second pad 13 is provided with one more metal layer and a corresponding via 40 compared with the second pad 12.

In another embodiment with further reference to FIG. 4b, a specific layer of metal pads among the second pads structured in a stack are connected in parallel with a metal line at a test layer, and the specific layer of metal pads are of the same metal layer as the metal line under test. For example, the second pads 12 and 13 are structured identically except that the second pad 12 is connected in parallel with the overlying metal line 30 via the metal pad at the same layer as the overlying metal line 30, and the second pad 13 is connected in parallel with the underlying metal line 50 via the metal pad at the same layer as the underlying metal line 50.

As required in practice, the second pads structured in a stack can be arranged at both ends of an across-layer metal line. Stated otherwise, one second pad is connected in parallel with an overlying metal layer at the other end of the across-layer metal line, and another second pad is connected in parallel with an underlying metal layer at the other end of the across-layer metal line. The second pads thus structured in a stack are commonly used in an electro migration test in which nano-probes 21 and 22 are used to acquire corresponding electrical parameters.

With the second pads structured in a stack according to the present embodiment, nano probing can be applied for an electrical test of an across-layer metal line. Also apparently, it is not necessary to strip destructively a metal layer of the integrated circuit during the test. In contrast, it is typical for a test on an across-layer metal line in the prior art to test a part of the metal line at a specific metal layer and then remove the metal layer by erosion after the test to expose an underlying metal layer, and subsequently test a part of the metal line at the underlying metal layer. However, such erosion demands for strict control on the amount of erosion and presents difficulty of ensuring uniformity. Insufficient erosion may fail to remove completely a metal layer which should be removed, and excessive erosion may damage an underlying metal layer. In general, this method of the prior art still can not test respective parts of an across-layer metal line simultaneously and thus can not detect a failure occurring with a via between two layers of the metal line. Therefore, the second pads structured in a stack according to the present embodiment can offer a solution to this issue in the prior art.

Again due to the metal pads 12 and 13 being sized larger than the metal line, the nano-probes 21 and 22 can be placed thereon more readily, so both the efficiency and the accuracy of applying a test portion can be improved.

An embodiment of the invention provides a method for testing an integrated circuit with the foregoing pad structure, which includes: probing and measuring the first pads by a probe suitable for the first pads to acquire corresponding electrical parameters; and probing and measuring the second pads at a specific test portion in the integrated circuit by a nano-probe to acquire corresponding electrical parameters.

In the foregoing embodiment, firstly the first pads are probed and measured to test proper functioning of the entire integrated circuit chip, and if improper functioning of the integrated circuit chip is found from the test, the nano-probe is subsequently used to test the second pads in the integrated circuit to position a circuit portion resulting in improper functioning.

The foregoing test method will be further explained below taking as an example a circuit debug process on a metal line.

Figure 5A:
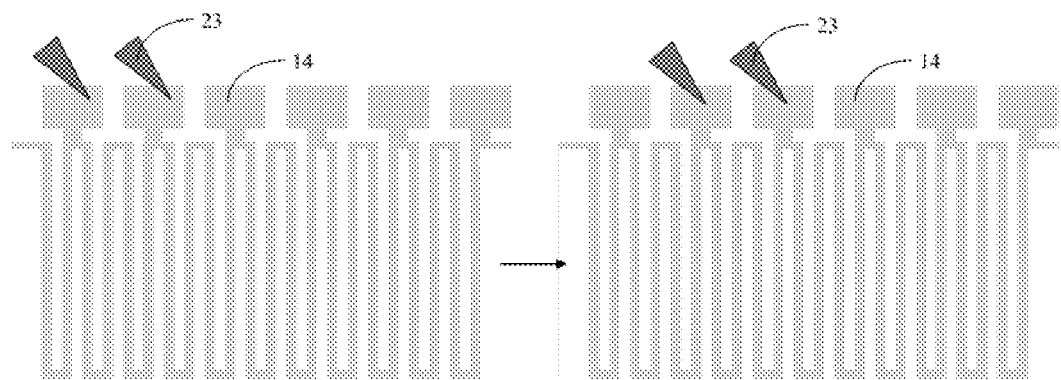

Referring to FIG. 5a, an embodiment of the circuit debug process along a metal line in the shape of multiple fingers may include probing and measuring sequentially adjacent second pads 14 in a test portion, which are connected in parallel with a metal line in the shape of multiple fingers, by a nano-probe 23. Corresponding electrical parameters are acquired by probing and measuring sequentially the adjacent second pads 14 to determine which metal line between two of the second pads 14 is occurred a failure. If the respective second pads 14 connected in parallel with the metal line in the shape of multiple fingers are arranged at a uniform interval, the probing and measuring process can also be performed automatically as long as both an interval between two nano-probes 23 for each time of probing and measuring and a movement distance between two times of probing and measuring are preset.

Figure 5B:
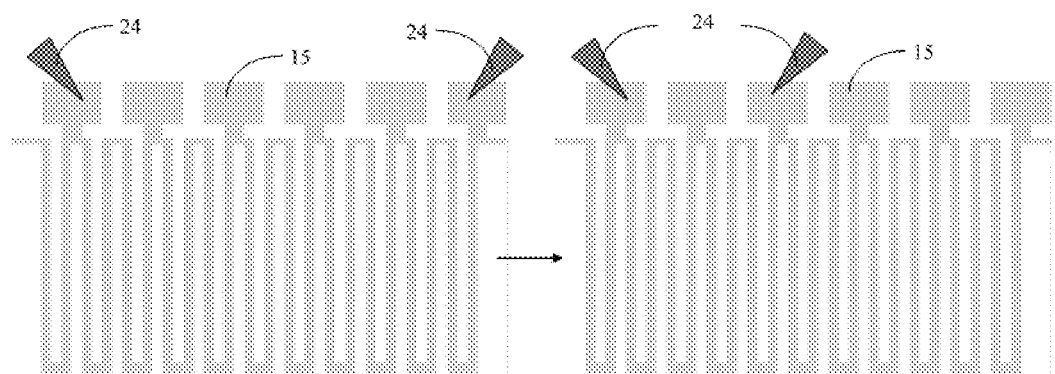
Figure 5B:
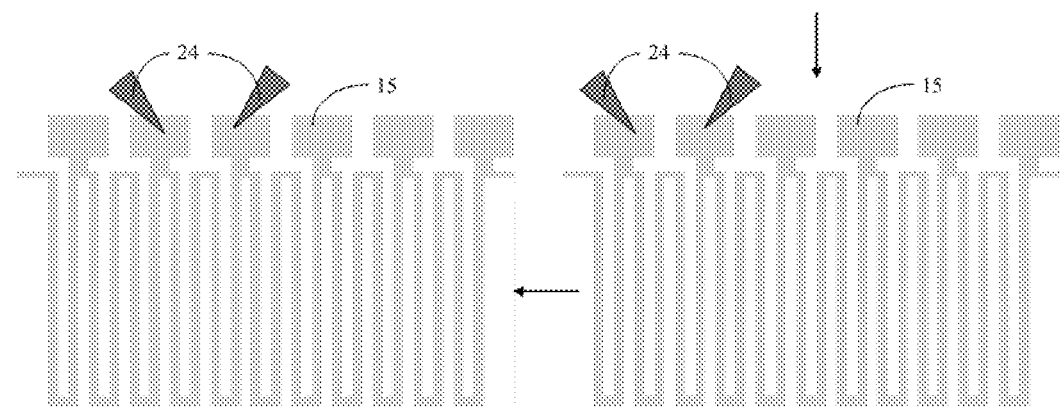

Referring to FIG. 5b, another embodiment of the test and circuit debug process along a metal line in the shape of multiple fingers may include probing and measuring, in a dichotomy way, adjacent second pads 14 in a test portion, which are connected in parallel with a metal line in the shape of multiple fingers, by nano-probes 24. Stated otherwise, the nano-probes 24 are used to probe and measure the second pads 15 at two ends of the test portion; then the test portion is divided into two halves, and the nano-probes 24 are used to probe and measure the second pads 15 at two ends of each half of the divided test portion; again the half of the divided portion is further divided into two halves, and the nano-probes 24 are used to probe and measure the second pads 15 at two ends of each half of the divided half of the portion, and so on. Probing and measuring of the second pads in a dichotomy way can enable faster positioning of an portion with an error relative to sequential probing and measuring of the adjacent second pads. Again if the respective second pads 15 connected in parallel with the metal line in the shape of multiple fingers are arranged at a uniform interval, the probing and measuring process can also be performed automatically as long as both an interval between two nano-probes 24 for each time of probing and measuring and a movement distance between two times of probing and measuring are preset.

In summary, the second pads are connected in parallel with a metal line in an integrated circuit, and since the size of the second pads is larger than the minimum characteristic dimension of the metal line in the integrated circuit and of the integrated circuit, it will be simpler to probe and measure the second pads by a nano-probe or normal probe to acquire electrical parameters and hence more efficient to position an test portion than to probe and measure directly the metal line in the integrated circuit by the nano-probe. Correspondingly, the nano-probe or normal probe can also be used to position the test portion with improved accuracy based upon the same reasoning.

Although the invention has been disclosed as above in connection with the preferred embodiments thereof, the invention will not be limited thereto. Any skilled in the art can make various variations and modifications without departing from the spirit and scope of the invention. Accordingly, the scope of the invention shall be as defined in the appended claims.

The invention claimed is:

1. A pad structure, comprising a plurality of first pads and a plurality of second pads, wherein the first pads are distributed over a peripheral portion of the integrated circuit and connected with lead-out wires of the integrated circuit, and the second pads are connected in parallel with an across-layer metal line at a circuit portion in the integrated circuit and are sized larger than the minimum characteristic dimension of the metal line and that of the integrated circuit and smaller than the size of the first pads, where the metal line is to be tested by using the second pads, and the across-layer metal line crosses at least two layers.

2. The pad structure according to claim 1, wherein the second pads are single-layered metal pads, and the single-layered metal pads are composed of the same metal as the layer of the metal line at the circuit portion in the integrated circuit.

3. The pad structure according to claim 1, wherein the second pads are structured in a stack consisted of one or more layers of metal pads and vias, and the metal pads at the lowest layer in the stack structure are connected in parallel with the metal line at a corresponding layer at the circuit portion in the integrated circuit.

4. The pad structure according to claim 1, wherein the second pads are structured in a stack consisted of one or more layers of metal pads and vias, and the metal pads at the same layer in the stack structure as the metal line at the circuit portion in the integrated circuit are connected with the metal line, while the remaining layers of metal pads float.

5. The pad structure according to claim 1, wherein the second pads are micro pads and the size of the micro pads is larger than 0.1 µm.

6. The pad structure according to claim 5, wherein the size of the second pads ranges from 1 µm to 40 µm.

7. The pad structure according to claim 6, wherein the size of the second pads ranges from 1 μm to 10 μm.

8. The pad structure according to claim 6, wherein the size of the second pads ranges from 10 μm to 40 μm.

9. A method for testing an integrated circuit with the pad structure according to any one of claims 1 to 8, comprising: probing and measuring first pads by a probe suitable for the first pads to acquire corresponding electrical parameters; and probing and measuring second pads at a specific test portion in the integrated circuit by a nano-probe or normal probe to acquire corresponding electrical parameters.

10. The method according to claim 9, wherein when probing and measuring a metal line in the integrated circuit, the nano-probe is applied on both adjacent second pads in the test portion which are connected in parallel with the metal line to perform the probing and measuring sequentially.

11. The method according to claim 10, wherein the probing and measuring are performed as an automatic test.

12. The method according to claim 9, wherein when probing and measuring a metal line in the integrated circuit, the nano-probe is applied on the second pads in the test portion which are connected in parallel with the metal line to perform the probing and measuring in a dichotomy way.

13. The method according to claim 12, wherein the probing and measuring are performed as an automatic test.

14. The method according to claim 9, wherein the first pads are firstly probed and measured to test proper functioning of the entire integrated circuit chip, and if improper functioning of the integrated circuit chip is found from the test, the nano-probe is subsequently used to test the second pads in the integrated circuit to position a circuit portion resulting in improper functioning.

15. The pad structure according to claim 1, wherein the second pads are structured in a stack consisted of one or more layers of metal pads and vias, one second pad is connected in parallel with an overlying metal layer at one end of the across-layer metal line, another second pad is connected in parallel with an underlying metal layer at the other end of the across-layer metal line, and the second pads thus structured in a stack are used in an electro migration test in which the second pads are used to acquire corresponding electrical parameters.

16. The pad structure according to claim 1, wherein the across-layer metal line is a multiple fingers metal line.

* * * * *